United States Patent
Starikov et al.

(10) Patent No.: US 6,608,360 B2
(45) Date of Patent: Aug. 19, 2003

(54) ONE-CHIP MICRO-INTEGRATED OPTOELECTRONIC SENSOR

(75) Inventors: David Starikov, Houston, TX (US); Igor Berishev, Tucson, AZ (US); Abdelhak Bensaoula, Houston, TX (US)

(73) Assignee: University of Houston, Houston, TX (US)

(*) Notice: Subject to any disclaimer, the term of this patent is extended or adjusted under 35 U.S.C. 154(b) by 0 days.

(21) Appl. No.: 09/738,728

(22) Filed: Dec. 15, 2000

(65) Prior Publication Data

US 2002/0074553 A1 Jun. 20, 2002

(51) Int. Cl.$^7$ ............................................. H01L 29/861
(52) U.S. Cl. ........................ 257/481; 257/449; 257/453; 257/454; 257/455; 257/456; 257/472
(58) Field of Search .................................. 257/449, 450, 257/453–456, 472, 476, 481; 438/653

(56) References Cited

U.S. PATENT DOCUMENTS

| | | | | |
|---|---|---|---|---|
| 4,900,373 A | * | 2/1990 | Chu et al. .................... | 148/33.4 |
| 5,082,629 A | | 1/1992 | Burgess, Jr. et al. ..... | 422/82.11 |
| 5,196,709 A | | 3/1993 | Berndt et al. ............ | 250/458.1 |
| 5,202,571 A | * | 4/1993 | Hirabayashi et al. ......... | 257/10 |
| 5,341,805 A | | 8/1994 | Stavridi et al. ............. | 128/633 |
| 5,442,169 A | | 8/1995 | Kunz .................... | 250/227.21 |
| 5,591,963 A | * | 1/1997 | Takeda et al. ........... | 250/214.1 |
| 5,822,473 A | | 10/1998 | Magel et al. .................. | 385/12 |
| 5,920,018 A | | 7/1999 | Wilkerson et al. ........ | 73/861.41 |
| 5,955,972 A | | 9/1999 | Wade ......................... | 340/960 |
| 5,990,500 A | * | 11/1999 | Okazaki ...................... | 257/99 |
| 5,995,229 A | | 11/1999 | Omi ........................... | 356/374 |
| 6,034,404 A | | 3/2000 | Soares ........................ | 257/415 |
| 6,075,611 A | | 6/2000 | Dussan V. et al. .......... | 356/432 |

OTHER PUBLICATIONS

Tempez, et al., "Photoenhanced reactive ion etching of III–V nitrides in $BCl_3/Cl_2/AR/N_2$ plasmas," *J. Vac. Sci. Technol. A* 17(4), Jul./Aug. 1999, p. 2209–2213.

Medelci, et al., "Reactive Ion Etching of Boron Nitride and Gallium Nitride Materials in $Cl_2/Ar$ and $BCl_3/Cl_2/AR$ Chemistries," Mat. Res. Soc. Symp. Proc. vol. 512, p. 285–291, 1998.

Starikov, et al., "A Hot Electrons–Based Wide Spectrum On–Orbit Optical Calibration Source," Space Technology and Applications International Forum–1998, p. 648–653.

Starikov, et al., "Metal–insulator–semiconductor Schottky barrier structures fabricated using interfacial BN layers grown on GaN and SiC for optoelectronic device applications," *J. Vac. Sci. Technol. A* 17(4), Jul./Aug. 1999, p. 1235–1238.

* cited by examiner

*Primary Examiner*—Long Pham
*Assistant Examiner*—Wai-Sing Louie
(74) *Attorney, Agent, or Firm*—Baker Botts L.L.P.

(57) ABSTRACT

This disclosure describes one-chip micro-integrated optoelectronic sensors and methods for fabricating and using the same. The sensors may include an optical emission source, optical filter and a photodetector fabricated on the same transparent substrate using the same technological processes. Optical emission may occur when a bias voltage is applied across a metal-insulator-semiconductor Schottky contact or a p-n junction. The photodetector may be a Schottky contact or a p-n junction in a semiconductor. Some sensors can be fabricated on optically transparent substrate and employ back-side illumination. In the other sensors provided, the substrate is not transparent and emission occurs from the edge of a p-n junction or through a transparent electrode. The sensors may be used to measure optical absorption, optical reflection, scattering or fluorescence. The sensors may be fabricated and operated to provide a selected spectrum of light emitted and a multi-quantum well heterostructure may be fabricated to filter light reaching the photodetector.

13 Claims, 11 Drawing Sheets

ONE-CHIP MICRO-INTEGRATED OPTOELECTRONIC SENSOR

FIELD OF THE INVENTION

This invention generally relates to optical measurements. More particularly, a light-emitting diode and a photodiode formed from the same growth processes on a single chip are provided, along with applications and methods for making.

BACKGROUND OF THE INVENTION

Optical sensors based on semiconductors commonly measure absorption/reflectance, scattering, luminescence, and fluorescence. Optical absorption measurements are commonly used for chemical sensors. The sensors usually consist of a Light-Emitting Diode (LED), two optical fibers and a photodiode (PD) or phototransistor. Light from the source is transmitted through the first fiber to a testing chamber filled with a reagent gas. The higher the gas concentration the less light is transmitted by the second optical fiber from the chamber to the photodetector. Rapid development and diversification of optical wave guide devices for the detection of toxic gases and vapors in air and small molecules in aqueous solutions has led to fabrication of practical integrated planar optical chemical sensors. The book *Chemical Sensors* by Edmonds, pp. 278–282, provides background information on this type of sensor.

Scattermeters and motion control encoders for motors use LEDs or laser sources to generate a beam of light, a surface under test or a patterned cylinder to reflect the beam, and a photodetector (PD) to monitor the variation of the scattered or reflected light. The optical encoders typically employ infrared emitters and detectors operating in the spectral range from 820 to 949 nm. Such components are usually based on p-n junctions formed on conventional semiconductors, such as silicon and gallium arsenide, and are temperature-sensitive, have large size, and require special arrangements to reject the ambient light.

Other optoelectronic sensors measure light-induced fluorescence. Measurement of fluorescence, the absorption of light energy at one wavelength and its emission at a longer wavelength, has become widely accepted as a highly specific, convenient, and sensitive analytical technique. A comparison of analytical techniques indicates that fluorometry is at least 1000-times more sensitive than absorption spectroscopy. Compounds not emitting fluorescent light may be labeled with a fluorescent reagent. Most remote systems have used the fluorescence resulting from excitation at a single wavelength. Greater discrimination can be achieved using multiple or broader optical beam excitation wavelengths. A broader beam can simplify the design and yield a remote monitoring tool capable of detecting a specific target substance in a varying background and indicating its concentration. For biomedical applications, using fluorophores on the ends of fibers can make possible simultaneous measurement of pH, carbon dioxide, and oxygen in a sample. Such a unit has been developed by CDI-3M Health Care, for example. Chemical testing has been demonstrated using fiber-optic fluorimmunoassay (FOFIA). In this technique, antigens specific for the antibodies to be detected are immobilized in proximity to a guided optical beam. The antibodies are tagged with fluorophores and allowed to bond to the antigens. Evanescent excitation of the fluorophores and/or collection of the resulting fluorescent radiation provide for extremely sensitive monitoring techniques.

Temperature can be determined by measuring fluorescence emission decay times from rare-earth-doped and transition-metal-doped phosphors. In another application of fluorescence, flow rates can be measured by dye dilution. Water flow, for example, can be measured by injecting and mixing a dye at a constant rate and using a fluorometer to determine how much the water stream has diluted the dye.

The commercially available optoelectronic device based on fluorescence, a "fluorometer," contains an excitation source, a sample cell, optical filters and a fluorescence detector. The excitation source is usually a deuterium or xenon lamp. Broadband excitation light from a lamp passes through a monochromator. Fluorescence from the sample is dispersed by another monochromator and detected by a photomultiplier tube. Scanning the excitation monochromator produces the excitation spectrum and scanning the fluorescence monochromator produces the fluorescence spectrum. Modem instruments use only bandpass interference filters to select the excitation and emission wavelengths and LEDs and photodiodes as light sources and detectors.

U.S. Pat. No. 5,822,473 discloses an integrated microchip chemical sensor. An LED light source, a waveguide and a silicon photodetector are placed on the same chip. The amount of light propagating through the wave guide and measured by the detector is affected by a chemical sensitive material coated on top of the waveguide.

U.S. Pat. No. 5,442,169 discloses an integrated optical sensor module on the same substrate using various configurations of a wave guide. The '169 patent requires the integration of at least one optical waveguide in the sensor to measure one or more variables and does not provide a method of sensor fabrication requiring only a single technological process. What is needed is an optoelectronic sensor containing both a light source and a detector that can be fabricated on a chip using a single technological process.

DESCRIPTION OF THE FIGURES

For a more complete understanding of the invention and the advantages thereof, reference is now made to the following description taken in conjunction with the following drawings in which like reference numbers indicate like features and wherein.

SUMMARY OF THE INVENTION

In one embodiment, an optoelectronic device having a metal-insulator-semiconductor Schottky contact is provided on a transparent substrate. A transparent semiconductor allows light to be emitted from and detected by the Schottky contact or barrier. The spectrum of emitted light may be controlled by controlling the bias voltage across the barrier or by changing the composition of the semiconductor. A single sensor may be used in pulse mode as a source and detector for measurement of fluorescence. The fluorescent sample may be placed directly in contact with the transparent base. The transparent semiconductor may be a III–V nitride compound, zinc oxide, silicon carbide, tin oxide, indium oxide or diamond. The insulating layer is preferably amorphous silicon. A plurality of the devices may be used for measurement of light absorption, reflection or scattering, The employment of pre-breakdown avalanche electroluminescense, which allows emission of light with energies higher than the semiconductor's band gap, allows spectral matching of the emission and photosensitivity spectra from diode structures based on the same semiconductor material. It also allow emission to extend into the UV range and makes possible emission at two different ranges from the same junction (pre-breakdown avalanche at a reverse bias and recombination at a forward bias.

In another embodiment, in one part of a transparent substrate a metal-insulator-semiconductor device is fabricated as a light emitting diode the transparent substrate a multi-quantum well heterostructure to filter light and a p-n junction serving as a photodetector are fabricated by the same technological processes. The structures may be fabricated in a pattern to increase sensitivity of the device. The spectrum of the light emitted and the light detected may be selected.

In yet another embodiment, optical emission from the edges of a p-n junction in a semiconductor is provided. The light may pass through a sample and a multi-quantum well heterostructure to be detected by another p-n junction.

In another embodiment, a transparent electrode is used in the light emitting diode and the photodetector. The light emitting diode includes a metal-insulator-semiconductor Schottky contact. The transparent electrode may be fluorine-doped tin oxide.

The devices disclosed may be used to measure surface roughness, absorption in samples, fluorescence from samples, may be tuned to be sensitive to selected wavelengths, as part of an optical encoder, and other uses.

Methods for making the devices on substrates are provided. Devices to function as a light emitting diode, an optical filter and a photodetector can be fabricated on a single chip or substrate. Growth processes include radio frequency-assisted molecular beam epitaxy and electron beam evaporation. Etching may be performed by the reactive ion process.

DESCRIPTION OF PREFERRED EMBODIMENTS

Figure 1:
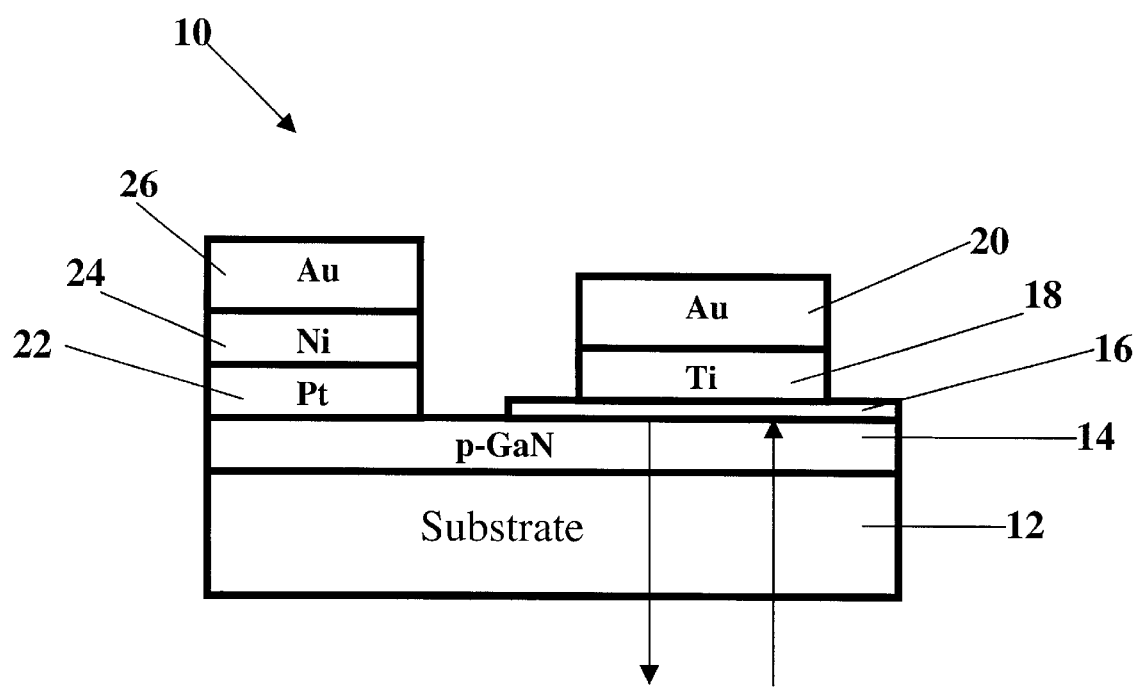
FIG. 1 illustrates the structure of a Schottky barrier diode on a substrate.

One embodiment of a one-chip micro-integrated optoelectronic sensor is shown generally at 10 in FIG. 1. As indicated by arrows representing light rays in the figure, structure 10 provides an optical emission source (LED) or a photodetector (PD) on a single substrate or chip. The device is fabricated on optically transparent semiconductor layer 14 and optically transparent substrate 12. Similar optoelectronic properties, device structures, and operation principles for the disclosed sensor can be achieved on several optically transparent semiconductor materials grown on optically transparent substrates. Materials that can be used for semiconductor layer 14 include in the near UV/visible range of the spectrum any of the III–V nitride compounds, zinc oxide (ZnO), silicon carbide (SiC), tin oxide ($SnO_2$), indium oxide ($In_2O_3$) and diamond. Materials that can be used for transparent substrate 12 include sapphire, quartz and optically transparent glasses. Only the characteristics of structures based on GaN and InGaN epitaxial layers grown by molecular beam epitaxy (MBE) on sapphire with silicon interface layers are described in detail herein. As shown in the figure, light emission and detection can occur at the Schottky barrier between p-GaN and titanium, with a thin layer of silicon at the interface, as described further below.

The structure of FIG. 1 employs two types of contacts. The first type is an ohmic contact to the p-type GaN layer. This may consist of platinum layer 22, nickel layer 24 and gold layer 26, the layers sequentially deposited directly on the p-GaN layer. For the ohmic contact, other combinations of metals providing ohmic characteristics (low specific resistance and linear I–V dependence) can be used, as is well known. The second type of contact is the Schottky barrier contact, which may consist of a titanium layer 18 and gold layer 20 deposited onto a silicon interfacial layer 16. For the barrier contact, metals other than titanium that have a low diffusion coefficient through the silicon interfacial layer under deposition conditions can be used. Other combinations of metals may be used to form the barrier contact in a Schottky barrier structure. Such methods are well known.

Layer 14 of p-gallium nitride (p-GaN) is preferably deposited on substrate 12 to a thickness in the range from about 0.5 to about 1 $\mu$m. Such thickness is high enough to provide high crystalline quality and electrical conductance and is low enough for production throughput considerations. A thin layer of silicon, preferably less than about 200 Å thick, and more preferably in the range of about 30–50 Å thick, is then deposited over a segment of the surface of the p-GaN. The silicon should be amorphous, so as to be an insulator to form a Metal-Insulator-Semiconductor (MIS) Schottky barrier. Other compounds may be used in place of the silicon to form MIS Schottky barriers on n-GaN, such as boron nitride and silicon dioxide. Any type of Schottky barrier that provides a barrier height sufficient for pre-breakdown avalanche electroluminescence to occur can be used. The thickness of the insulator layer should be small enough to allow tunneling of the carriers from the Schottky contact to the semiconductor and it should be uniform enough to provide uniform distribution of optical emission over the contact area. The insulator layer should be thick enough to provide formation of a Schottky barrier sufficient for pre-breakdown avalanche electroluminescence to occur. A layer of metal 18, which may be titanium, is then deposited on the silicon layer to establish the Schottky barrier. Layer 20, which may be gold, is then deposited on metal layer 18 to provide good conductivity of the contact along its surface.

A fabrication process that may be used to fabricate the one chip optoelectronic sensor containing a single Schottky barrier on a substrate (FIG. 1) is as follows:

1) grow by Radio Frequency (RF)-assisted Molecular Beam Epitaxy (MBE) a 200 nm thick undoped GaN buffer layer on the substrate, which may be sapphire, at a substrate temperature of 600–700° C.;

2) grow by RF-assisted MBE a 0.5–1 $\mu$m barrier GaN layer doped with magnesium (preferably $N_A - N_D \cong 5 \times 10^{17}$ $cm^{-3}$) at a substrate temperature of 700–750° C.;

3) on a first segment of the surface of the p-GaN, deposit a Schottky barrier contact by electron-beam evaporation of Si (30–50 Å), Ti (100–300 Å), and Au (1000–3000 Å) at a substrate temperature of 200–500° C.; and 4) on a second segment of the surface of the p-GaN, deposit an ohmic contact by electron-beam evaporation of Pt (30–50 Å), Ni (100–300 Å), and Au (1000–3000 Å) at a substrate temperature of 200–500° C.

Figure 2:
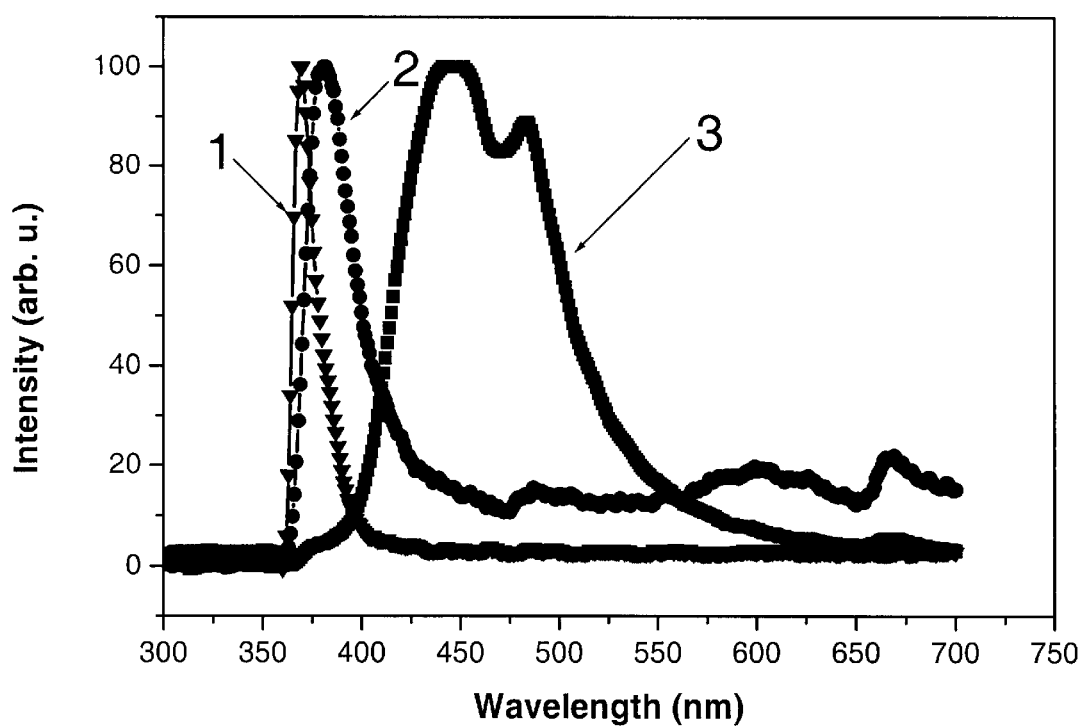
FIG. 2 shows spectral characteristics of the diode of FIG. 1.

The structure shown in FIG. 1 exhibits UV/blue optical emission at reverse bias and photosensitivity at no bias. Referring to FIG. 2, the normalized spectrum of light produced by the device with a reverse bias of 22 volts across the Schottky barrier is shown by curve 2 and photosensitivity of the device at zero bias is shown by Curve 1. An overlap in the spectra for optical emission and for photosensitivity exists in the range from about 365 nm to 415 nm. This means that the same device can be used in applications as a source and as a photodetector if bias is adjusted. Physical configurations for such applications are described below. The employment of pre-breakdown avalanche electroluminescence allows light to be produced with shorter wavelength than would be allowed by the semiconductor's bandgap. This is believed to make possible unique sensors based of the structure described herein. This capability permits spectral matching of emission and photosensitivity spectra from a diode structure based on the same semiconductor material. The emission can also be extended into the UV range, and emission can be produced in two different spectral ranges from the same junction.

The sensor's performance is based on interaction of the media under test with the initial optical emission generated by the optical emission source when the diode is biased and measurement by the photodetector in the absence of bias of (1) absorption, (2) reflection, (3) scattering or (4) fluorescence. The first three measurements can be made with Curve 1 and Curve 2 of FIG. 2, but two Schottky barrier contacts are needed to provide absorption, reflection and scattering measurements because emission and sensing occur simultaneously.

The optical emission source (Curve 2) is a Light Emitting Diode (LED) and the photodetector (Curve 1) is a Photo Diode (PD). The sensor's performance is based on the spectral match between the PD and the LED in absorption, reflection and scattering measurements. The match illustrated in FIG. 2 is achieved by employing avalanche electroluminescence (or other devices that yield a similar emission spectrum), which occurs in a reverse biased LED and generates photons with energies higher than the semiconductor's band gap. The ohmic contact can be common for both LED and PD functions.

For use of the device of FIG. 1 to detect fluorescence, either conditions that produce curve 2 or curve 3 of FIG. 2 may be employed. Light intensity under conditions producing curve 3 is much higher at the same voltage, but curve 2 extends deeper into the ultraviolet (UV). Curve 3 is the spectrum of emission with a forward bias of 8 volts. Increasing the bias voltage from +8 to +22 volts has only slight effect on the spectrum. The spectral match between the PD and fluorescence emission excited in the media by the LED emission is important for these measurements. For sensors based on fluorescence the spectral match may be achieved by tuning the semiconductor material band gap based on changing the material composition, as explained below. Because the gallium nitride layer and the sapphire substrate are optically transparent, the device can be used by placing the sample in contact with the sapphire window. The silicon layer is thin enough to avoid losing transparency. As indicated in FIG. 1, both the emission of the excitation light and the detection of the returning fluorescence light occur at the MIS interface. The function of the silicon is to provide a tunnel-transparent interfacial layer that: (a) increases the potential barrier height resulting in higher device efficiency, (b) possibly passivates, neutralizes or compensates defects or/and doping centers in a very thin GaN surface layer, thereby eliminating the "leakage" in the I–V characteristics, and (c) reduces the possibility of interaction (diffusion) between the metal contact and the semiconductor. The MIS interface is more effective than an M-S Schottky barrier because (a) MS in this case results in "leaky" diodes, and (b) MIS provides higher potential barrier heights that are especially important for devices based on hot electron pre-breakdown avalanche electroluminescence.

Figure 3:
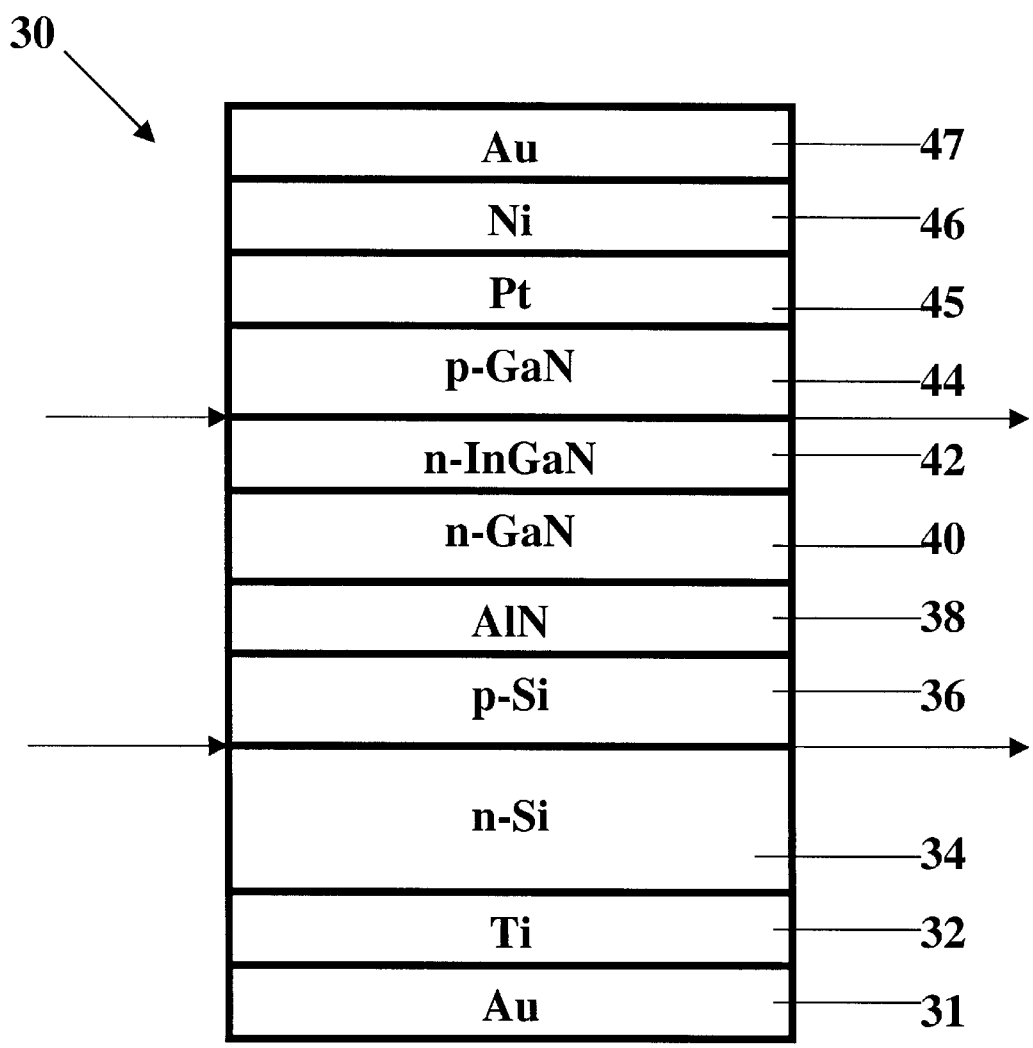
FIG. 3. illustrates the structure of p-n heterojunctions grown on a wafer and having ohmic contacts.

FIG. 3 represents a structure of optoelectronic device 30 that is based on a p-GaN/n-InGaN heterostructure grown on a silicon substrate. The structure of device 30 produces emission from p-n junctions rather than from a Schottky barrier, as illustrated in FIG. 1. Gold layer 31 and titanium layer 32 establish ohmic contact with n-silicon wafer 34. Aluminum nitride layer 38 is deposited on wafer 34 and in the process produces p-silicon layer 36 as a result of aluminum diffusion into the silicon. n-GaN layer 40 is then deposited, followed by n-InGaN layer 42 and p-GaN layer 44. The thickness of these layers may be in the range from about 0.5 to about 1 μm. The thickness should be enough to provide high crystalline quality and electrical conductance and low enough for production cost consideration. The composition of the InGaN was determined by the following process parameters: the In and the Ga fluxes were kept equal during the growth, which would theoretically produce $In_{0.5}Ga_{0.5}N$ ($In_xGa_{(1-x)}N$, where x=0.5). Compositions of In of up to 0.2 have been achieved without sacrificing the quality of the layers. Although varying the InGaN composition affects the position of the smaller long-wavelength optical emission peak, this variation is not important for fluorescence excitation.

Figure 4:
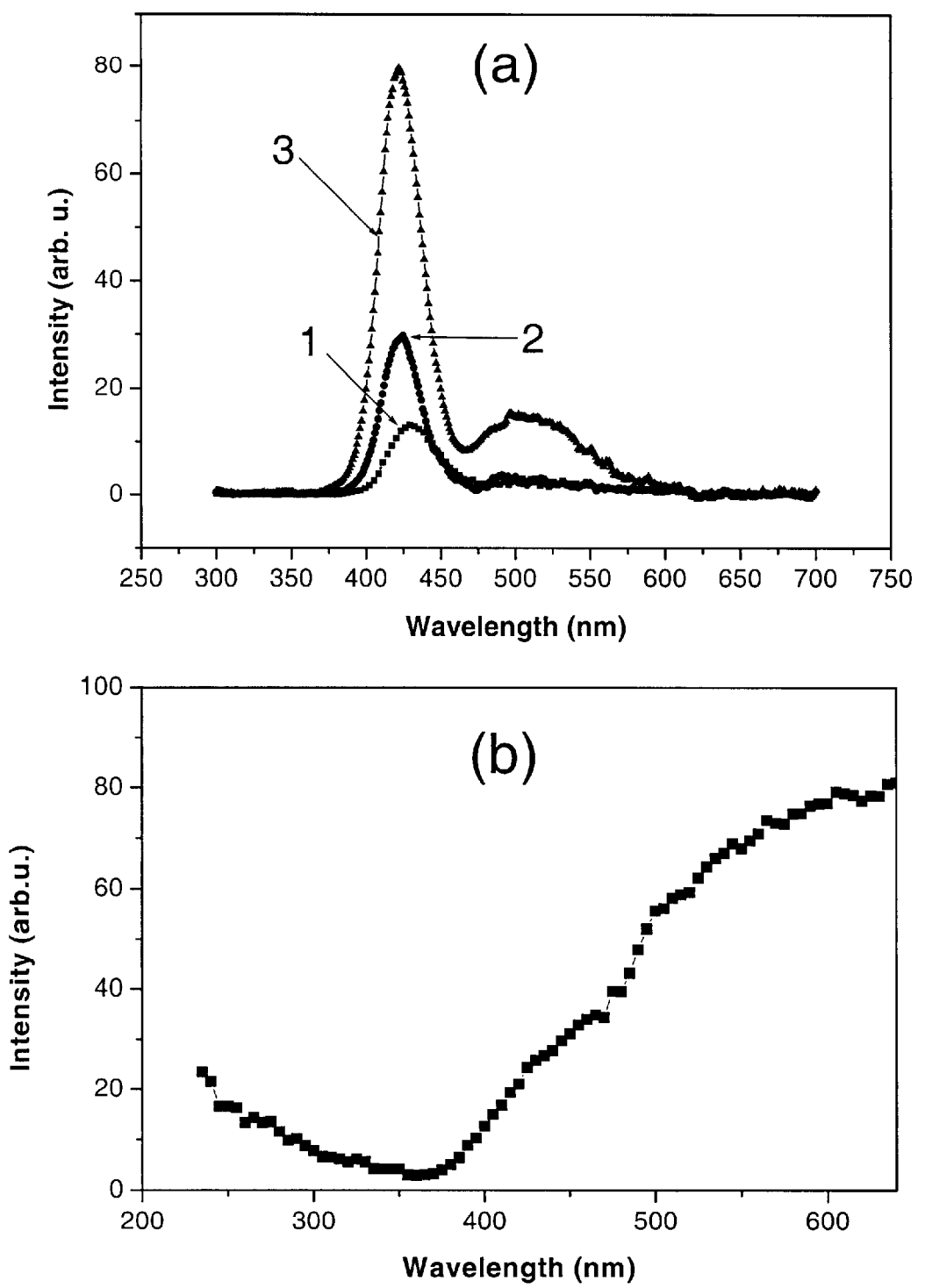
FIG. 4 shows the optical emission(a) and spectral sensitivity(b) of the device of FIG. 3 at different values of applied voltage.

FIG. 4(a) shows the spectrum of light emitted from the edge of the device with a composition of indium of 0.5 at the p-n junctions under differing voltages applied across the device. Curves 1, 2 and 3 correspond to voltage of 9.8 volts and a current of 74 mA; 10.5 volts and 79 mA; and 11.3 volts and 84 mA, respectively. The optical emission, the result of recombination electroluminescence in the p-GaN/n-InGaN heterojunction, was observed from the side under the forward bias applied to the top and bottom electrodes. Emission from the edges of this structure was in the blue/UV range. Photosensitivity with zero bias is in the spectral range from near UV to near infrared, as shown in FIG. 4(b). Both optical emission and photosensitivity were measured from the structure's edge because an opaque metal electrode was deposited on top of the structure. The spectral sensitivity (photovoltaic signal versus wavelength) from this structure was measured under irradiation with a xenon lamp and no bias. The photovoltaic signal measured at wavelengths from 225 to 650 nm from the electrodes on the top and on the bottom of the structure was produced mostly by absorption in the p-GaN/n-InGaN heterostructure (225–365 nm) and p-Si/n-Si (250–650 nm), but also enhancement of the optical absorption can be observed on the spectrum in the range 365–460 nm. Enhancement of the absorption in the range of 365–460 nm (which appears as a hump on the long wavelength peak left shoulder of FIG. 4b) is produced by the absorption in the InGaN layer. This range is well matched with the corresponding photoluminescence peak measured from the GaN/InGaN heterostructures. In addition to the intentional GaN p-n junction, diffusion of Al into Si during the AlN buffer layer deposition results in formation of an additional p-Si/n-Si junction.

Figure 5:
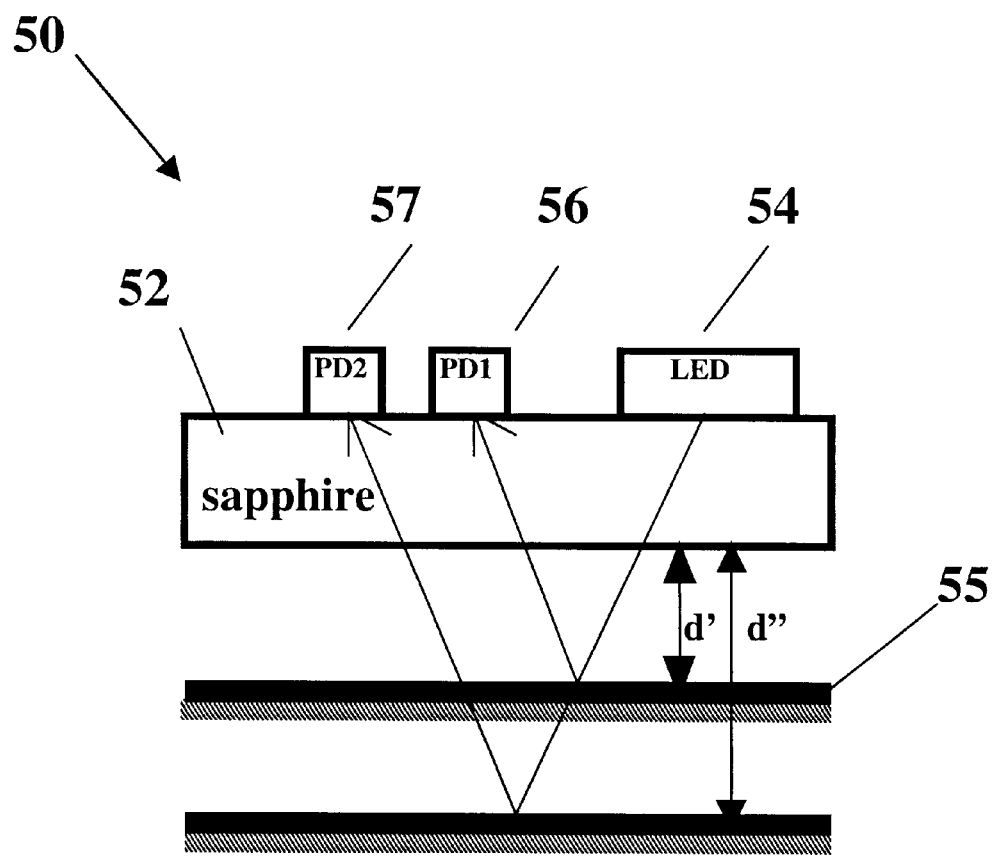
FIG. 5 illustrates an optoelectronic roughness or absorption sensor.

Application of the optoelectronics device having the layer structure depicted in FIG. 1 and fabricated on a single chip to a device for sensing surface roughness by scattering measurements or measuring optical absorption is illustrated in FIG. 5, shown generally at 50. The device may use pre-breakdown avalanche electroluminescence, scattering, and photovoltaic effects. The design of the sensor is based on fabrication in a single technological process and on the same sapphire substrate 52 of avalanche electroluminescence light emitting diode (LED) 54 and spectrally matched photodiodes (PD) 56 and 58. Both the LED and the PDs use Schottky barriers.

Since light distribution from the LED is close to Lambertian, a portion of it falls at an angle onto the surface under test 55, which is partially reflecting and is placed at a distance d' from substrate 52. Light that is partially reflected and partially scattered by surface 55 is sensed by photodiode 56. The higher the roughness of the surface the more light is scattered and the lower the signal from photodiode 56. Photodiode 58 serves for precise reproducible adjustment of the distance in a very small range (from d' to d") by keeping the difference between signals from photodiode 56 and photodiode 58 at a constant level. Such positioning is important in measurements with surfaces that are not flat (curved or having steps). Pulsed mode LED operation is preferably employed together with lock-in amplification and detection of the signals in order to eliminate possible noise produced by ambient light.

A structure similar to that shown in FIG. 5 can be employed for measurements in the optical absorption mode if surface 55 is a mirror. The sample is then placed between mirror 55 and substrate 52. In this case the photodetectors will measure the optical emission reflected from the mirror and changed by the absorption in the tested media. For the reflection mode operation, a surface that changes its optical reflection under the influence of the sample under test can be employed instead of a mirror. Alternatively, the configuration of LED 54 and one or more photodetectors such as 56 can be any that will provide that emitted light passes through a sample and impinges on a sensitive surface of the photodetector.

For fluorescence mode operation a device structure that contains only one Schottky barrier structure similar to those described in the FIG. 1 can be employed. In this case the Schottky barrier structure contact serves both as a source of optical emission and a photodetector. The operation of the sensor is in a pulsed mode. First, a short pulse of current (preferably in a nanosecond range) is supplied to the Schottky contact under the forward bias (for blue emission), or reverse bias for UV/blue emission. The optical emission generated by the pulse in the Schottky barrier contact will excite the fluorescence in the sample under test. The decay time of this fluorescence should be long enough to allow measurement of emission after the pulse is applied. Preferably, the decay time is in the microsecond range. During this time no voltage will be applied to the Schottky barrier structure. The photovoltaic signal (voltage or current) will be measured from the contact instead. This signal will depend on the presence and/or concentration of the fluorescing medium under test. Such structures can be employed for sensing fluorescence of compounds that have sufficient fluorescence decay times. Such fluorescence should be excited by the optical emission produced by the Schottky barrier structure.

Figure 6:
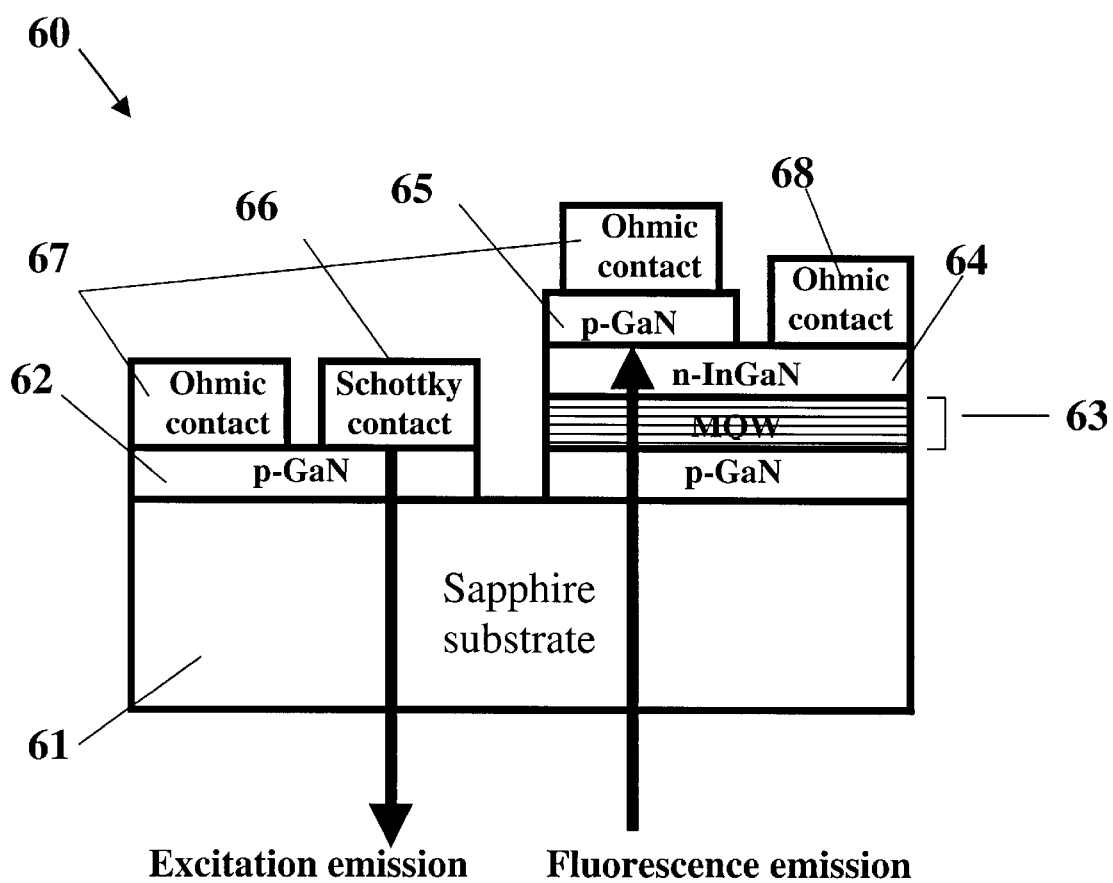
FIG. 6 illustrates the structure of a fluorescence sensor fabricated on a sapphire substrate.

An alternative embodiment of a device for sensing fluorescence is illustrated generally at 60 in FIG. 6. Layers are first grown on sapphire substrate 61 in the following sequence: p-GaN layer 62, then multi-quantum well (MQW) region 63 of GaN/InGaN, then n-InGaN layer 64, then p-GaN layer 65. After this layer growth, the photodetector structure is etched through layer 62 to produce two insulated parts: one for the LED and one for the PD. The LED system contains p-GaN layer 62 with ohmic contact 66 and rectifying Schottky barrier contact 67. The PD system contains a p-GaN/n-InGaN junction and ohmic contacts 67 and 68 to the p-GaN layers 62, 65 and n-InGaN layer 64, respectively.

more detailed fabrication process for the sensor of FIG. 6 with a Schottky barrier and a p-n junction fabricated using a single technological process is as follows:

1) grow by RF-assisted MBE a 100–200 nm thick undoped GaN buffer layer on sapphire at a substrate temperature of 600–700° C.;

2) grow by RF-assisted MBE a 0.5–1 $\mu$m barrier GaN layer doped with Mg ($N_D-N_A \sim 6 \times 10^{17}$ cm$^{-3}$) at a substrate temperature of 700–750° C.;

3) grow by RF-assisted MBE 1–100 Å thick alternating undoped In$_x$Ga$_{1-x}$N and GaN layers; (The In composition of ($\chi$ from 0 to 0.2), number of layers and their thickness are specified from calculations of the required MQW filter optical transmission band parameters, such as $\lambda_{max}$ and FWHM.) using well known methods of calculation, to form the Multi-Quantum Well (MQW) region;

4) grow by RF-assisted MBE a 0.5–1 $\mu$m barrier n-In$_{0.2}$Ga$_{0.8}$N layer doped with Si ($N_D-N_A \sim 5 \times 10^{18}$ cm$^{-3}$) at a substrate temperature of 600–800° C.;

5) grow by RF-assisted MBE a 0.5–1 micrometer barrier GaN layer doped with Mg ($N_D-N_A \sim 6 \times 10^{17}$ cm$^{-3}$) at a substrate temperature of 700–750° C.;

6) dry etch by Reactive Ion Etching (RIE) the area between the LED part and the PD part through the bottom p-GaN layer;

7) dry etch by RIE the LED part to p-GaN and half of the photodetector part to the n-InGaN layer;

8) deposit a Schottky barrier contact on one half of the LED part by e-beam evaporation of: Si(30–50 Å), Ti (100–300 Å), and Au (1000–3000 Å) at a substrate temperature of 200–500° C.;

9) deposit ohmic contacts on the other half of the LED part and the RIE-etched part of the photodetector part by e-beam evaporation of: Pt (30–50 Å), Ni (100–300 Å), and Au (1000–3000 Å) at a substrate temperature of 200–500° C.; and 10) deposit an ohmic contact on the RIE-etched photodetector part by e-beam evaporation of: Ti (100–300 Å), and Au (1000–3000 Å) at a substrate temperature of 200–500° C.

By use of the term "single technological process" we mean that all III–V nitride layers for all integrated sensor structures are grown in a single cycle (one chamber, one load and one pump-down). This capability to grow the layers in a single technological process is an important feature of the methods and apparatus disclosed herein.

A forward bias (usually from 3 to 12 V) produces an optical emission in the spectral range of 365–650 nm (curve 3, FIG. 2), and at a reverse bias of 8 to 22 volts the same structure produces emission in the spectral range from 365–450 nm (curve 2, FIG. 2). This light is transmitted through sapphire substrate 61 and is absorbed by the medium containing the substance under test. As a result, a secondary optical emission in a spectral range 450–572 nm may be generated by a fluorescent substance that is present in the medium. The p-GaN/n-InGaN Multi Quantum Well (MQW) heterostructure 63 grown in the photodetector part of the sensor structure serves as an optical transmission filter that can be tuned to detect the emission from fluorescent materials with specific emission wavelengths. The InGaN band gap, the number of layers and their thickness in the structure determine its optical transmission properties such as maximum wavelength, intensity, and full width of half maximum (FWHM). The principle is based on the variation of the refractive index and absorption properties (band gap) of the InGaN layers with In content. The limits of In incorporation are described below. The optical transmission (reflection) dependence on the width (which should be one-quarter wavelength) and number of layers is known from production of dielectric interference filters (mirrors). The thinner the layers in the stack the shorter will be the filter's wavelength. The larger the difference between the refractive indices in the alternating layers the smaller will be the secondary transmission peaks. The more layers in the stack the lower will be the intensity of the transmission peak and the narrower the peak will be.

The n-InGaN and p-GaN photodetector barrier layers 64 and 65 are grown on top of MQW heterostructure 63. The total spectral range of the photodetector together with the MQW heterostructure is determined by the longest effective wavelength of the LED structure (450 nm) and the wavelength corresponding to the narrowest band gap of the InGaN material. The corresponding wavelengths achieved to date are 450 and 572 nm. Longer wavelengths should be possible as well. A variety of other LEDs have been developed, but none of them can be fabricated in a single process with other sensor components on the same chip.

The sensor disclosed herein and illustrated in FIG. 6 is also capable of measuring the changes in fluorescence (intensity, lifetime, decay) from a known material depending on its concentration, temperature, or flow. Depending on the nature of the material under test, different configurations or designs can be used. For example, the material to be tested can be directly deposited on the surface of substrate 61. The high mechanical, chemical, and thermal strength of sapphire allows simple removal of the tested material after the test is complete by mechanical, chemical, or thermal methods. Measurements in gases or liquids in containers or pipelines that exclude ambient light can be carried out by immersing the sensor structure directly in the container or pipe. In this case no attachment to the sensor structure is required. When rejection of the ambient light is not provided by the container, an attachment can be made to the sapphire substrate. This attachment may provide rejection of ambient light while allowing the species to contact the sapphire substrate and be removed after the measurements are complete. Such attachment can be fabricated by well developed methods of silicon micromachining and bonding to sapphire used for MEMS production.

Figure 7:
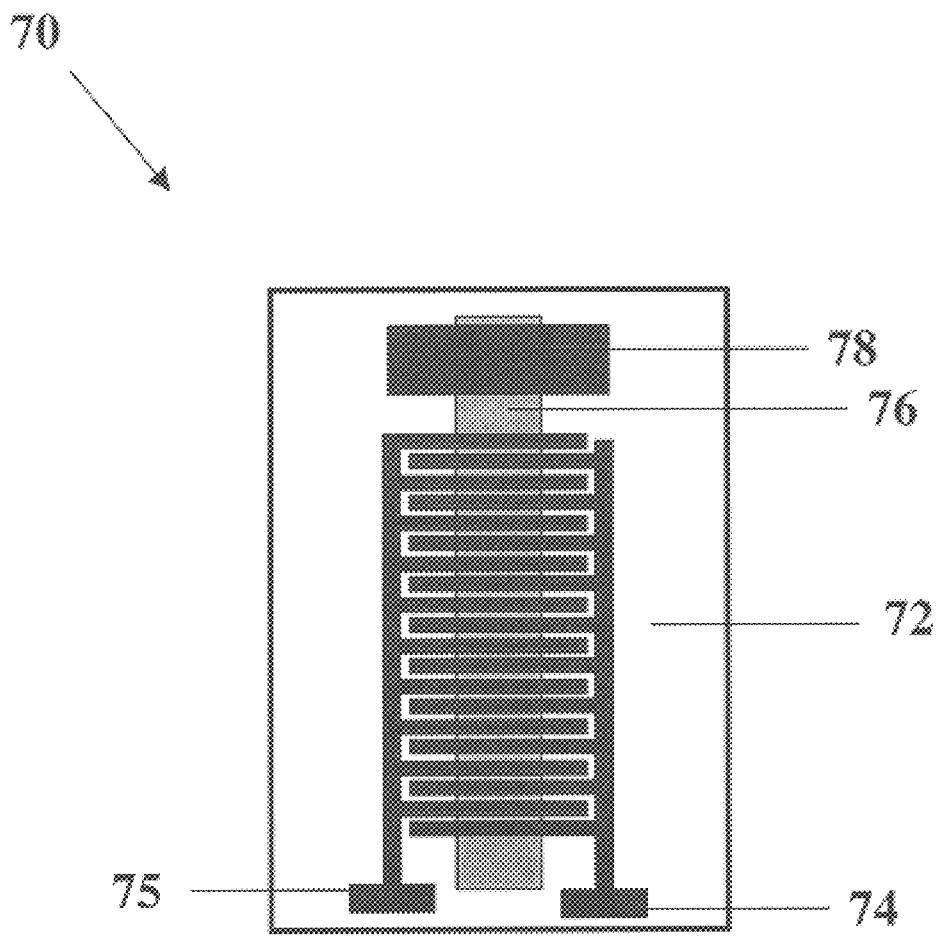
FIG. 7 illustrates interlaced LED and PD structures to gain sensitivity.

The devices of FIG. 1 or FIG. 6 can also be constructed to include a selected number of LED structures and PD structures on a single chip to increase sensitivity. Pixels of each structure can be arranged in a selected pattern, such as that shown in FIG. 7. Patterned device, generally shown at 70, includes substrate 72, which may be sapphire, and patterned Schottky contacts 74 and 75 on p-GaN layer 76. Ohmic contact 78 is deposited on the p-GaN.

Alternatively, the optoelectronic sensor may be fabricated on silicon wafers instead of sapphire. This may provide lower fabrication costs. Though not transparent, silicon can be fabricated at a much lower cost than sapphire. A structure grown on silicon and having UV transparent top electrodes is shown generally at 80 in FIG. 8. In addition, silicon that is already integrated into the planar structure can be used for photovoltaic sensing in a range of wavelengths from near UV to near IR. In particular, for the fluorescence sensor silicon gives the possibility to have a short wavelength (UV/Blue) optical emission source based on p-GaN/n-InGaN heterojunction and a wide range photodetector based on p-Si/n-Si fabricated in a single technological process on the same semiconductor chip, as it was shown in FIG. 3.

Figure 8:
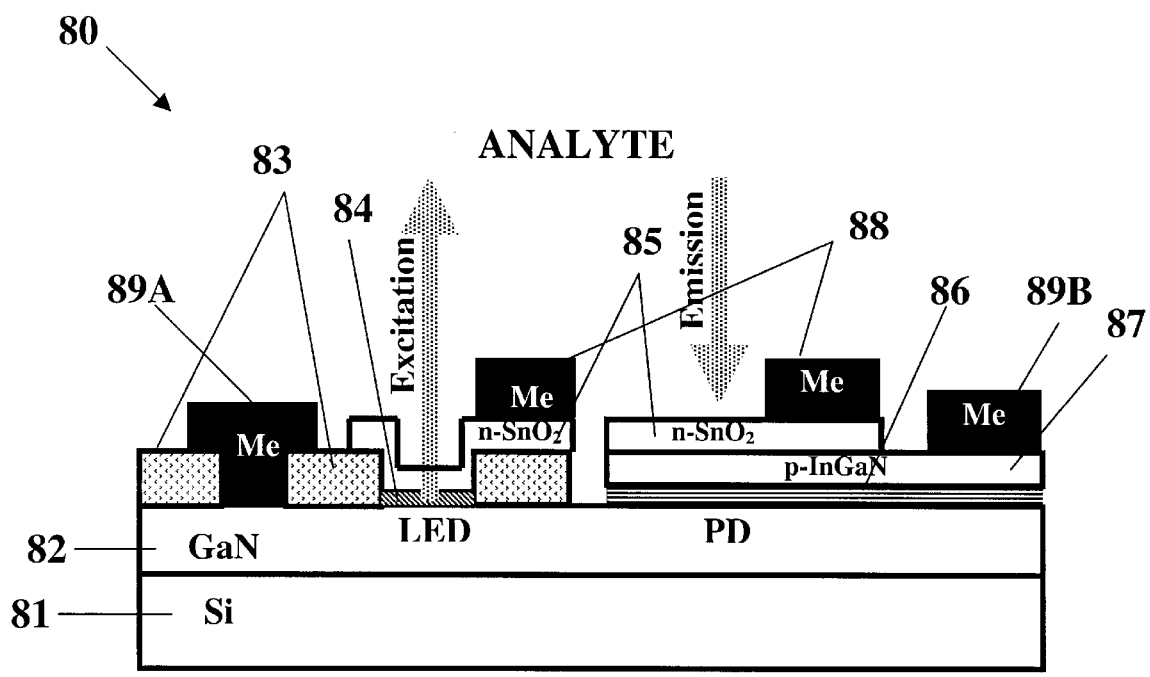
FIG. 8 illustrates a fluorescence sensor on a silicon substrate with UV-transparent electrodes.

Referring to FIG. 8, silicon substrate 81 is used to grow GaN layer 82 under conditions described above. Dielectric 83 and interfacial layer 84 are deposited and patterned. A fluorine-doped n-type tin oxide ($SnO_2$) layer 85, which is transparent to UV and visible light, can be used as a transparent top electrode and forms a MIS Schottky barrier on GaN. MQW region 86 may be formed to serve as an optical filter. A p-InGaN layer 87 grown on the top of the MQW 86 region and the n-type tin oxide layer 85 form a p-n junction for the photodetector. Finally, ohmic contacts 88, 89A and 89B are deposited on tin oxide, GaN and p-InGaN, respectively.

Figure 9:
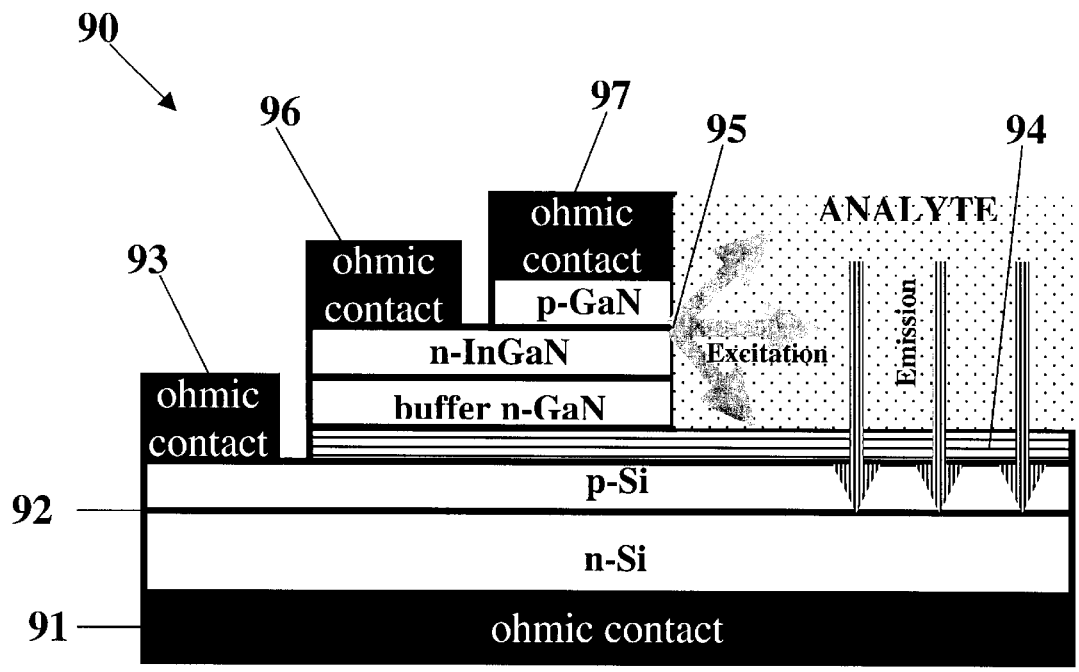
FIG. 9 illustrates the structure of a one-chip micro-integrated optoelectronic fluorescence sensor for measurements of solutes such as glucose.
Figure 10:
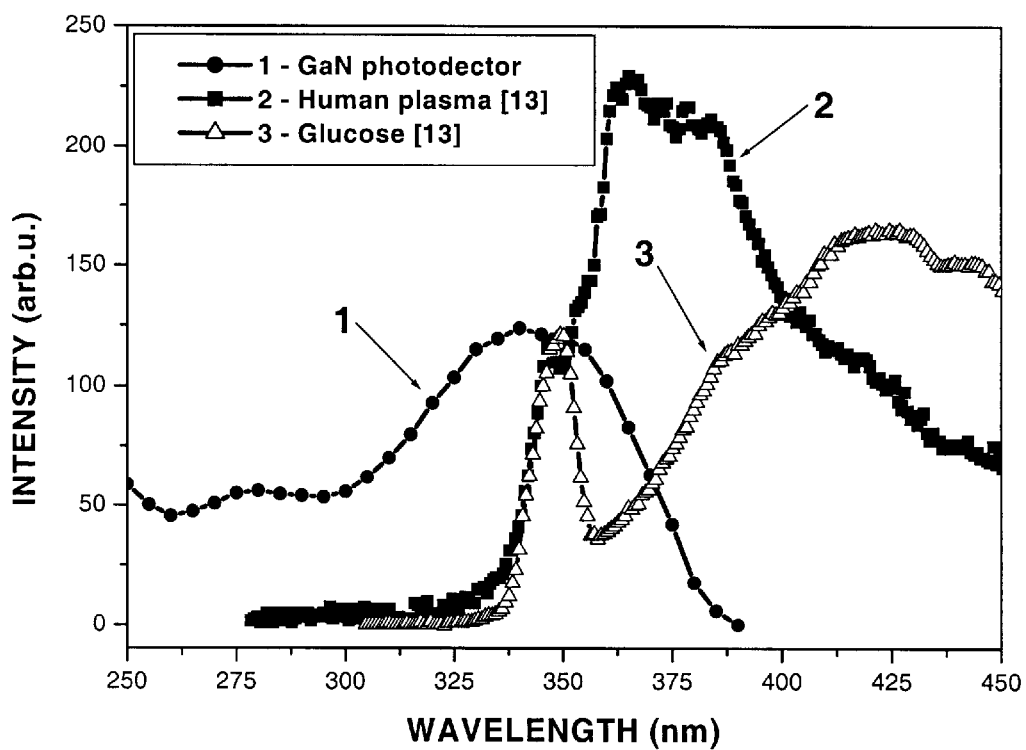
FIG. 10 shows the normalized spectral sensitivity of a gallium nitride-based photodetector and the fluorescence emission spectra of human plasma and glucose.

A one-chip micro-integrated fluorescence sensor that may be used for glucose measurements is shown generally at 90 in FIG. 9. Metal layers 91 and 93 serve as ohmic contacts across a p-n junction in silicon layer 92, which serves as a photodetector (PD). Multi-quantum well region 94 serves as an optical filter for light reaching the PD. Light emission occurs from the edges of junction 95 upon application of a selected voltage between contacts 96 and 97. The sensor may be immersed in the analyte. Of course, the sensor may be placed in a closed container or fluid conduit, such as in a pipeline or the bore of a well. The layers are the same as shown in FIG. 3 except MQWs are added to serve as an optical filter. The AlN, GaN, and InGaN layers may be grown by RF plasma-assisted molecular beam epitaxy. Multi-Quantum Well (MQW) heterostructure 94 of alternating AlN and InGaN undoped layers is grown with a thickness for each layer preferably less than 100 Å. By changing the number of layers, their thickness, and In concentration in the InGaN compounds the optical transmission band width and the maximum wavelength may be tuned in the spectral range from 200 to 653 nm. The number and thickness of the layers, and In concentration can be precisely calculated prior to the growth, as is well known, to determine the spectral band of the sensor. The ranges of these parameters are limited only by the capabilities of specific technological processes used. In this manner the spectral sensitivity of the photodetector can be tuned to a wavelength of 345 nm corresponding to the spectral maximum of the glucose fluorescence, as shown in FIG. 10.

After the growth of the MQW heterostructure, deposition of a 1 μm thick Si-doped n-GaN and a 1 μm n-InGaN layer may be performed. A 1000 Å thick Mg-doped p-GaN layer may be grown then to complete the p-n junction heterostructure.

Beginning this structure with an AlN layer avoids formation of silicon nitride and allows doping of the top of the silicon wafer with Al for p-type Si layer formation. After the nitride layers' growth the structure is patterned with photoresist. The pattern is preferably about 10 to about 50 μm wide strips or windows. Reactive Ion Etching (RIE) is then performed to remove the nitride layers to the MQW region and to partially etch the nitride layer strips area to the n-InGaN and Si layer for deposition of the ohmic contacts 97 and 93, respectively.

A similar structure can be employed for other than glucose compounds by tuning the optical transmission of the MQW heterostructure to the specific fluorescence wavelengths of the compound being analyzed. The Si-based p-n junction formed during the AlN growth can be employed for sensing in a wider (from 400 to 1100 nm) range of wavelengths. The sensitivity of the Si junction is higher than for any III–V nitride-based junctions.

The GaN layers of FIG. 9 and other GaN layers disclosed in FIGS. 1 and 3 may be grown by RF plasma source-assisted molecular beam epitaxy (MBE) using a Uni-bulb source (Applied EPI). This method allows a growth rate of about 1 μm/hour on (0001) sapphire or silicon substrates. The GaN synthesis may be carried out during the evaporation of Ga from an effusion cell heated to 950° C., in a nitrogen flow of 2 sccm. A 200 Å thick AlN buffer layer may be grown at a substrate temperature of 700° C. prior to the growth of the doped layers, which will preferably be carried out at a substrate temperature of 700–750° C. Mg is preferably employed for p-type doping. The total thickness of the GaN films may be about 1 μm. The p-type layers may be characterized by Hall measurements, SIMS, and photoluminescence.

The n-InGaN layers are grown by the same method in the same process on top of the GaN layers. A series of experiments should be performed prior to the complete structure growth in order to optimize growth parameters for tuning the material's bandgap to the desired range of optical transmission. Tuning of the bandgap in the InGaN layers is achieved by changing the In composition in the compound. The incorporation of In depends mostly on the substrate temperature and on the ratio between the Ga and In fluxes. The maximum possible In content is determined by the excess of the N flux over the Ga flux:

$$\chi_{max} = 1 - f_{Ga}/f_N$$

This means that in order to achieve high In content the Ga flux should be significantly lower than the In flux. The substrate temperatures should be also varied in this task to change the In composition in the InGaN layers. The grown InGaN layers may be characterized by Hall measurements, SIMS, and photoluminescence. Usually compositions of In up to 0.2 (in $In_xGa_{(1-x)}N$) are used.

Masking of the layers before etching can be performed by conventional methods of photolithography. Standard positive and negative photoresists can be employed. The etching of the nitride layers is preferably by Reactive Ion Etching (RIE). Reactive ion etching of the samples may be performed in a Plasma-Therm 790 and an Oxford Plasma Technology Plasmalab 80 μp system. Since both AlN and InGaN layers can be etched using the same chemistry, the AlN/InGaN structures may be etched using the same gas mixture of 10 sccm $BCl_3$/10 sccm $Cl_2$/10 sccm Ar (or $N_2$) at a pressure of 30 mTorr. The RF power is normally varied from 50 to 250 W, which corresponds to a dc self-bias range of −140 to −400 V. An etch rate of 2000 Å/min has been achieved for GaN layers by employment of a photo assisted RIE process. Etch rates may be measured on the patterned samples using a Tencor 250-alpha step profilometer. XPS may be employed to investigate any resulting surface stoichiometry modification from etching. For this purpose, a Perkin-Elmer PHI ESCA system may be used.

The contact layers+ deposition may be carried out by e-beam evaporation at a substrate temperature of about 400° C. A combination of Ti (about 30 Å) and Au (about 3000 Å) may be employed for ohmic contact formation to n-type InGaN, and a combination of Pt (30 Å), Ni (300 Å) and Au (3000 Å) may be used for ohmic contact formation to p-GaN. The contact layers are patterned using conventional methods of photolithography and wet etching. After the patterning, the ohmic contacts are preferably annealed at a temperature in the range from about 400° C. to about 600° C. in $N_2$ for approximately 30 minutes to decrease specific contact resistance. The specific ohmic contact resistance may be determined by four-probe measurements.

The preferred embodiment for the sensor fabrication process of the sensor of FIG. 9 is as follows:

1) grow by RF-assisted MBE 100–200 nm thick undoped AlN buffer on (111) Si at a substrate temperature of 600–700° C.;

2) grow by RF-assisted MBE 1–100 Å thick alternating undoped layers of AlN and $In_xGa_{1-x}N$. The In composition, number of layers, and their thickness are specified from the calculations of the required MQW filter optical transmission band parameters, such as $\lambda_{max}$ and FWHM;

3) grow by RF-assisted MBE a 0.5–1 μm buffer n-GaN layer doped with Si ($N_D-N_A \equiv 5 \times 10^{18}$ cm$^{-3}$) at a substrate temperature of 600–800° C.;

4) grow by RF-assisted MBE a 100–200 nm barrier n-$In_{0.2}Ga_{0.8}N$ layer doped with Si ($N_D-N_A \equiv 5 \times 10^{18}$ cm$^{-3}$) at a substrate temperature of 600–800° C.;

5) grow by RF-assisted MBE a 100–200 nm barrier p-GaN layer doped with Mg ($N_A-N_D \equiv 5 \times 10^{17}$ cm$^{-3}$) at a substrate temperature of 700–750° C.

6) deposit ohmic contact layers to p-GaN by e-beam evaporation of Pt (30–50 Å), Ni (100–300 Å), and Au (1000–3000 Å) at a substrate temperature of 200–500° C.;

7) dry etch by RIE openings (for example, trenches) to the top of the MQW heterostructure, to the n-InGaN layer and the Si layer;

8) deposit an ohmic contact to the bottom of the n-Si substrate by e-beam evaporation of Ti (100–300 Å) and Au (1000–3000 Å) at a substrate temperature of 200–500° C.;

9) deposit ohmic contacts to p-Si on the edges of the chip by e-beam evaporation of Al (100–300 Å), Ti (1000–3000 Å), and Au (1000–3000 Å) at a substrate temperature of 200–500° C.; and 10) deposit an ohmic contact to the n-InGaN layer by e-beam evaporation of Ti (100–300° C.) and Au (1000–3000° C.) at a substrate temperature of 200–500° C.

The sensor of FIG. 9 can be applied in a variety of applications. In addition to those disclosed above, an integrated absorption/reflection/scattering chemical sensor may be fabricated for detection and concentration measurements of contaminants in fluids and gases, such as measurement of contaminants in water and measurement of billirubin in blood. An integrated absorption/reflection/scattering surface morphology sensor can be fabricated for measurements of surface roughness, detection of surface defects or detection of surface contaminants. An integrated high temperature optoelectronic motion control sensor that could be used in motors or engines can be fabricated. An integrated chemical fluorescence sensor for use on water effluents or high-pressure down hole fluids for characterization or identification and concentration measurements may be fabricated. Since the optoelectronic couple is fabricated on the same chip, the optical reflection principle can be employed for the delivery of the light from the LED to the PD.

A Schottky contact to p-GaN (such as shown in FIGS. 1 and 6) is preferably formed by e-beam evaporation of Si (30 Å), Ti (300 Å), and Au (3000 521 ). The potential barrier height for the Schottky barrier contacts may be determined by I–V and C–V characterization. Ultrasound microbonding may be applied to provide electrical connections to the structure carrier. The sensor structure (semiconductor and contact layers, microbonding) may be covered from the backside with a chemically and thermally stable waterproof compound. The front side of the sapphire substrate should be left clean to insure maximum optical transmission. A similar thermally stable and waterproof compound should be employed to protect metal contacts and bonding in silicon-based sensors. The III–V nitride layers and transparent conductive electrodes based on oxide semiconductors used in such sensor fabrication are chemically stable and can be exposed to a high variety of analytes. In order to avoid leakage in sensors exposed to electrically conductive analytes, a passivation of the sensor's surface by deposition on it of optically transparent dielectric materials, such as silicon dioxide or aluminum oxide may be employed.

Figure 11:
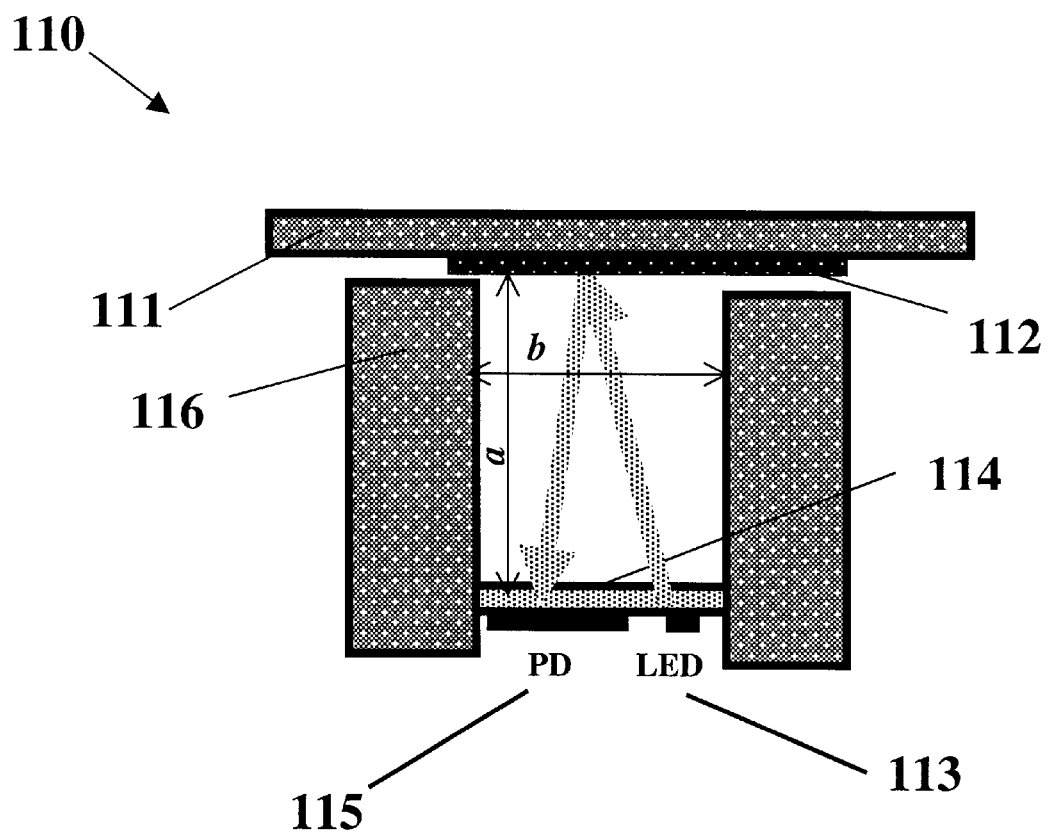
FIG. 11 shows a configuration of an optical encoder employing the integrated LED and PD.

FIG. 11 illustrates an optical encoder, shown generally at 110, which employs a one chip-integrated LED and photodetector and reflection for light delivery. Rotatable encoding disk 111 may be a silicon wafer with a highly UV-reflective metal (Pt or Au) coating 112. Coating 112 may be patterned by precise photolithography methods to produce highly UV reflective and absorptive areas. Additionally, the UV-absorptive uncoated Si may be etched to totally eliminate optical reflection. The UV light from LED 113 passes through substrate 114 and is reflected from segments of the surface of coated encoder disk 111. When disk 111 is in motion, photodetector 115 generates a waveform or digital output. The employment of silicon for the disk fabrication is motivated by availability of high resolution (in submicron range if necessary) patterning methods and compatibility with micromachining methods used for MEMS fabrication. Optical shields 116, which may also be made of Si, may be used to eliminate reflection from "neighboring" reflective areas and for attachment of the optoelectronic chip including LED 113 and PD 115. LED 113 and PD 115 may have the layers described in FIG. 1. The dimensions of optical shields 116 are optimized to ensure maximum efficiency of the optoelectronic couple. The distance a should be selected to provide maximum reflection from the coated area of the encoding disk to the photodetector. The distance b can be made smaller than 0.1 in. Two or more such channels between optical shields can be employed for monitoring of directional or angular displacements. Silicon micromachining and micromotor fabrication can be employed to fabricate the encoding disk rotational mechanism.

Although the present invention has been described with reference to specific details, it is not intended that such details should be regarded as limitations upon the scope of the invention, except as and to the extent that they are included in the following claims.

What we claim is:

1. An optoelectronic device for providing light emission or detection, comprising:
   an optically transparent substrate;
   an optically transparent semiconductor layer on the substrate, the semiconductor layer being selected from the group of substances consisting of III–V nitride compounds and having a top surface;
   an amorphous silicon layer on a first area of the top surface of the semiconductor layer, the amorphous silicon layer having a selected thickness to provide tunneling from a Schottky barrier and produce avalanche electroluminescence and detection;
   a layer of metal on the amorphous silicon layer, the metal forming a Schottky barrier and being selected to provide low diffusion rate of the metal through the amorphous silicon layer under conditions of deposition of the layer, and an ohmic contact to the layer of metal; and
   an ohmic contact on a second area of the top surface of the semiconductor layer.

2. The device of claim 1 wherein the material of the optically transparent substrate is selected from the group of substances consisting of sapphire, quartz and glass.

3. The device of claim 1 wherein the thickness of the amorphous silicon layer is less than about 200 Angstroms.

4. The device of claim 1 wherein the thickness of the amorphous silicon layer is in the range from about 30 Angstroms to about 50 Angstroms.

5. The device of claim 1 wherein the layer of metal on the amorphous silicon layer is titanium.

6. The device of claim 1 wherein the ohmic contact on the second area of the top surface of the semiconductor is comprised of layers of platinum, nickel and gold.

7. An optoelectronic device, comprising:
   an optically transparent substrate;
   two or more optically transparent spaced apart semiconductor layers on the substrate, each of the semiconductor layers being selected from the group of substances consisting of 111–V nitride compounds and having a top surface;
   an amorphous silicon layer on a first area of the top surface of each of the spaced apart semiconductor layers, each of the amorphous silicon layers having a selected thickness to provide tunneling from a Schottky barrier and produce avalanche electroluminescence and detection;
   a layer of metal on each of the amorphous silicon layers, the metal forming a Schottky barrier and being selected to provide low diffusion rate of the metal through the amorphous silicon layer under conditions of deposition of the layer, and an ohmic contact to the layer of metal; and
   an ohmic contact on a second area of the top surface of the semiconductor layers.

8. The device of claim 7 wherein the material of the optically transparent substrate is selected from the group of substances consisting of sapphire, quartz and glass.

9. The device of claim 7 wherein the thickness of the amorphous silicon layers is less than about 200 Angstroms.

10. The device of claim 7 wherein the thickness of the amorphous silicon layers is in the range from about 30 Angstroms to about 50 Angstroms.

11. The device of claim 7 wherein the metal in the layer of metal on the amorphous silicon layers is titanium.

12. The device of claim 7 wherein the ohmic contact on the second area of the top surface of the semiconductor layers is comprised of layers of platinum, nickel and gold.

13. The device of claim 7 wherein Schottky contacts form a pattern on the substrate.

* * * * *